United States Patent
Parvizi et al.

(10) Patent No.: US 10,320,374 B2
(45) Date of Patent: Jun. 11, 2019

(54) FINE RESOLUTION HIGH SPEED LINEAR DELAY ELEMENT

(71) Applicant: Ciena Corporation, Hanover, MD (US)

(72) Inventors: Mahdi Parvizi, Ottawa (CA); Sadok Aouini, Gatineau (CA); Naim Ben-Hamida, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 15/489,221

(22) Filed: Apr. 17, 2017

(65) Prior Publication Data
US 2018/0302070 A1    Oct. 18, 2018

(51) Int. Cl.
*H03K 5/13*    (2014.01)
*H03K 5/134*    (2014.01)
*H03K 5/00*    (2006.01)

(52) U.S. Cl.
CPC ............... *H03K 5/13* (2013.01); *H03K 5/134* (2014.07); *H03K 2005/00019* (2013.01); *H03K 2005/0028* (2013.01); *H03K 2005/00195* (2013.01)

(58) Field of Classification Search
CPC .................................. H03K 5/13; H03K 5/131
USPC ....... 327/261, 276, 277, 278, 281, 284, 285, 327/288, 419, 427, 434, 574, 581
See application file for complete search history.

(56) References Cited

U.S. PATENT DOCUMENTS

| 3,879,688 A * | 4/1975 | Hayashi ................... H03C 1/36 327/306 |
| 5,805,006 A | 9/1998 | Sutardja et al. |
| 8,854,099 B1 | 10/2014 | Miao |
| 2004/0095209 A1 | 5/2004 | Mori |

OTHER PUBLICATIONS

Aug. 21, 2018 International Search Report issued in International Application No. PCT/US2018/027236.

* cited by examiner

*Primary Examiner* — William Hernandez
(74) *Attorney, Agent, or Firm* — Clements Bernard Walker PLLC; Christopher L. Bernard; Lawrence A. Baratta, Jr.

(57) ABSTRACT

A controlled transconductance circuit (CTC) is disclosed. The CTC includes (i) a transistor comprising a drain terminal, a gate terminal, and a transistor source terminal, (ii) a biasing circuit element connected between the transistor source terminal and a CTC source terminal, and a variable capacitor connected between the transistor source terminal and a constant voltage terminal where the constant voltage terminal is adapted to receive a constant voltage, and (iii) a CTC control terminal adapted to control a transconductance of the CTC by controlling a capacitance of the variable capacitor.

20 Claims, 8 Drawing Sheets

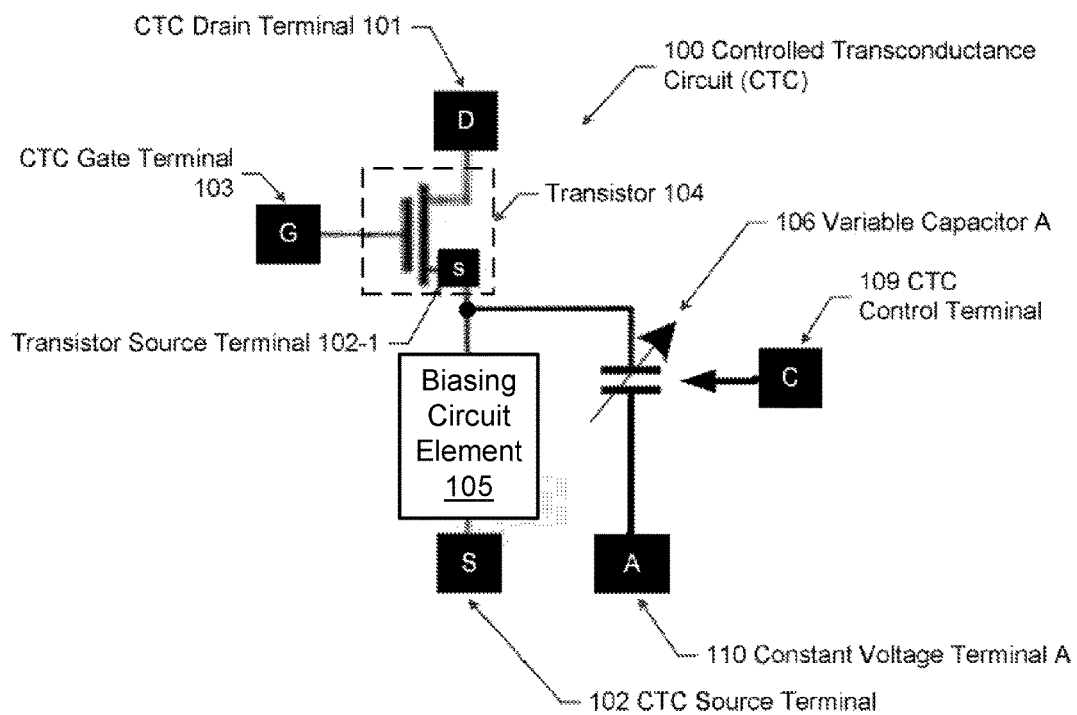
*FIG. 1.1*
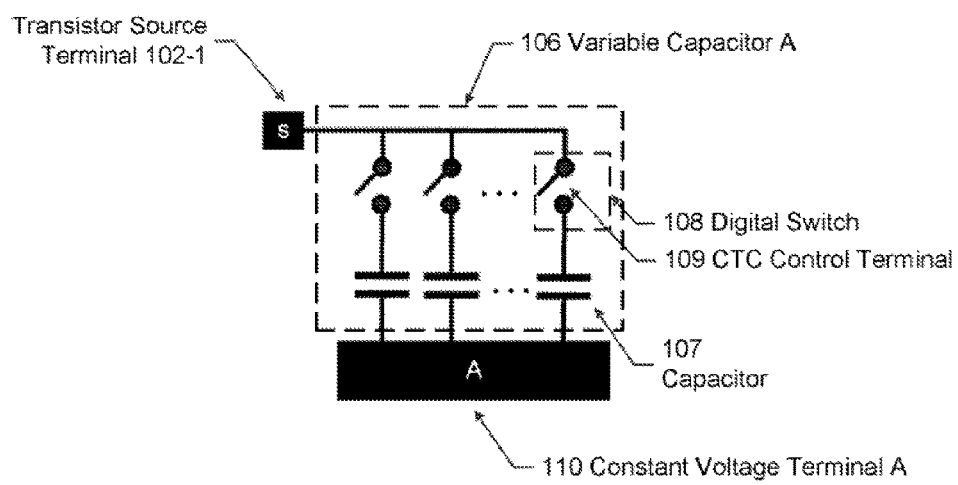
*FIG. 1.2*

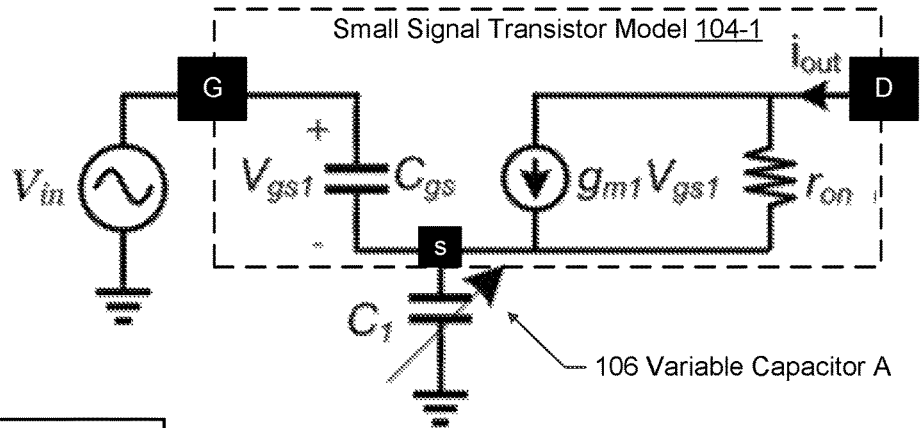
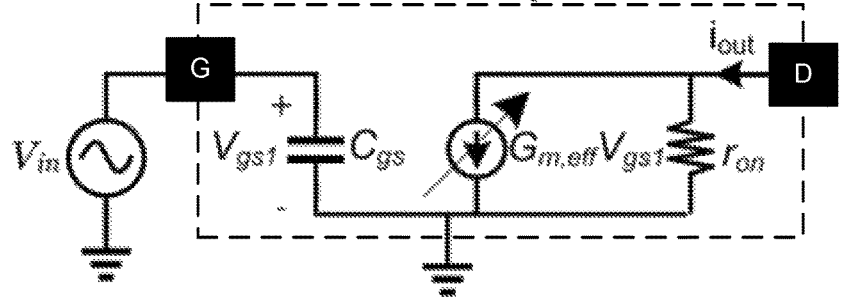
*FIG. 1.3*

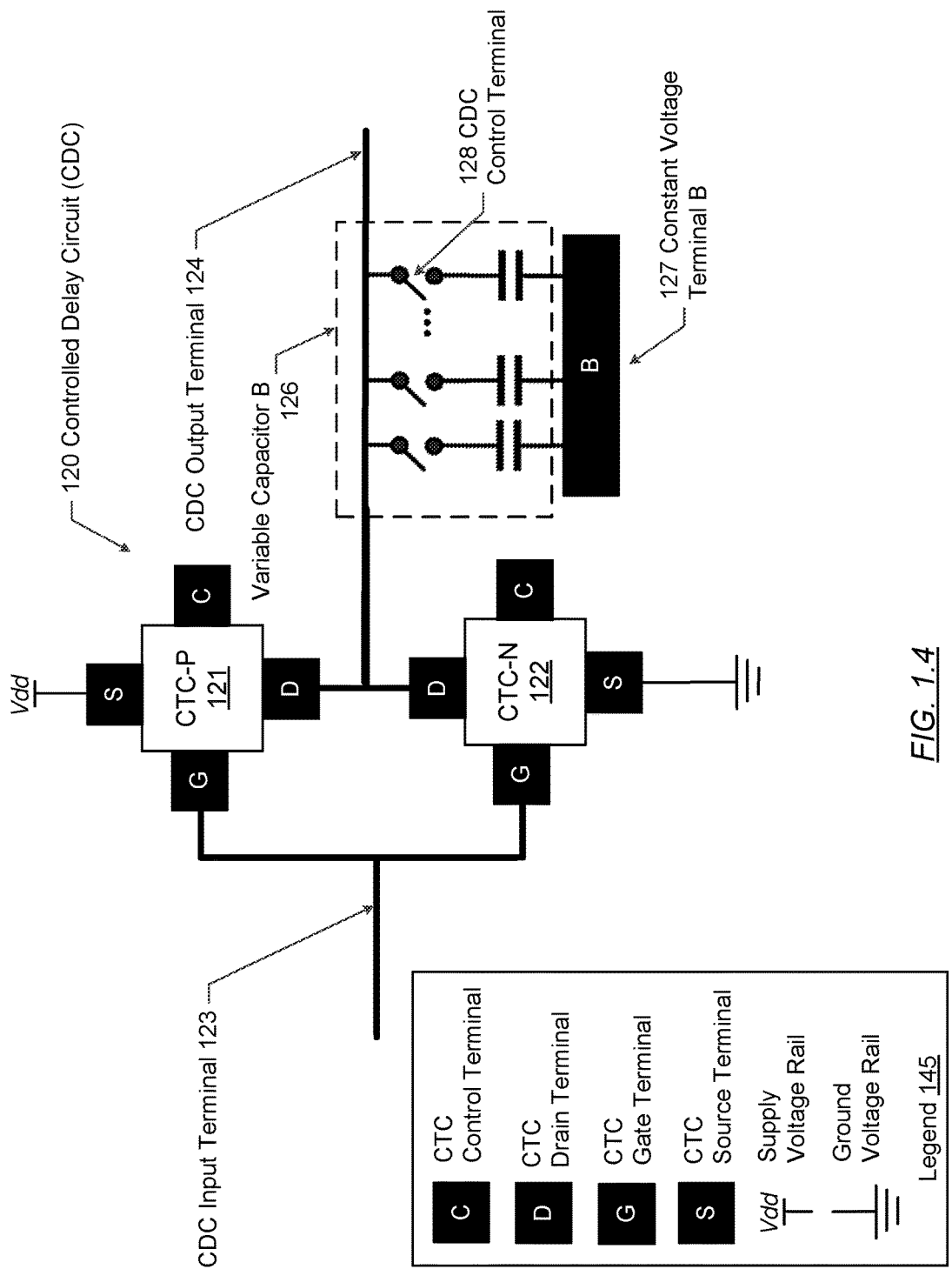
FIG. 1.4

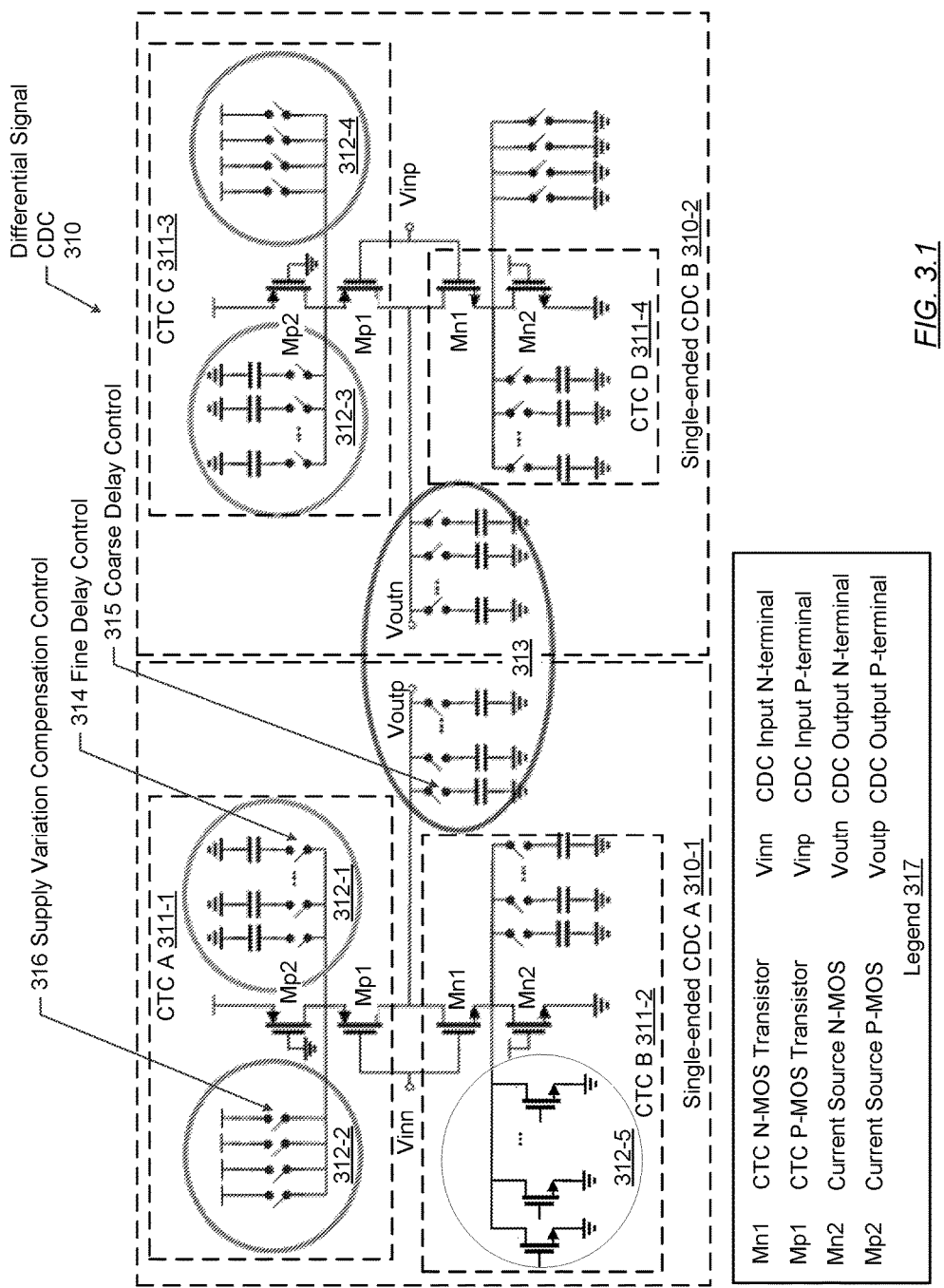
FIG. 3.1

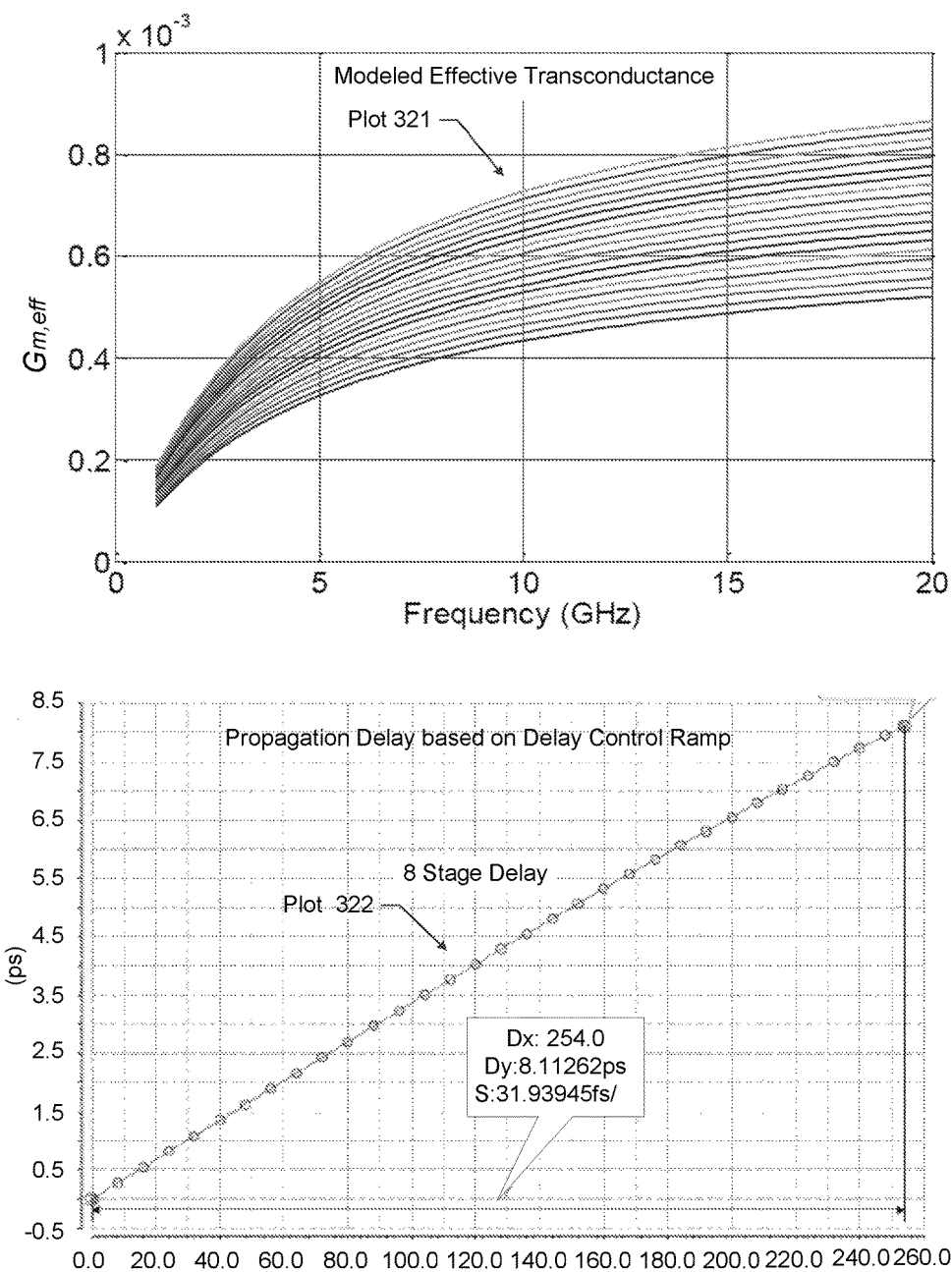
FIG. 3.2

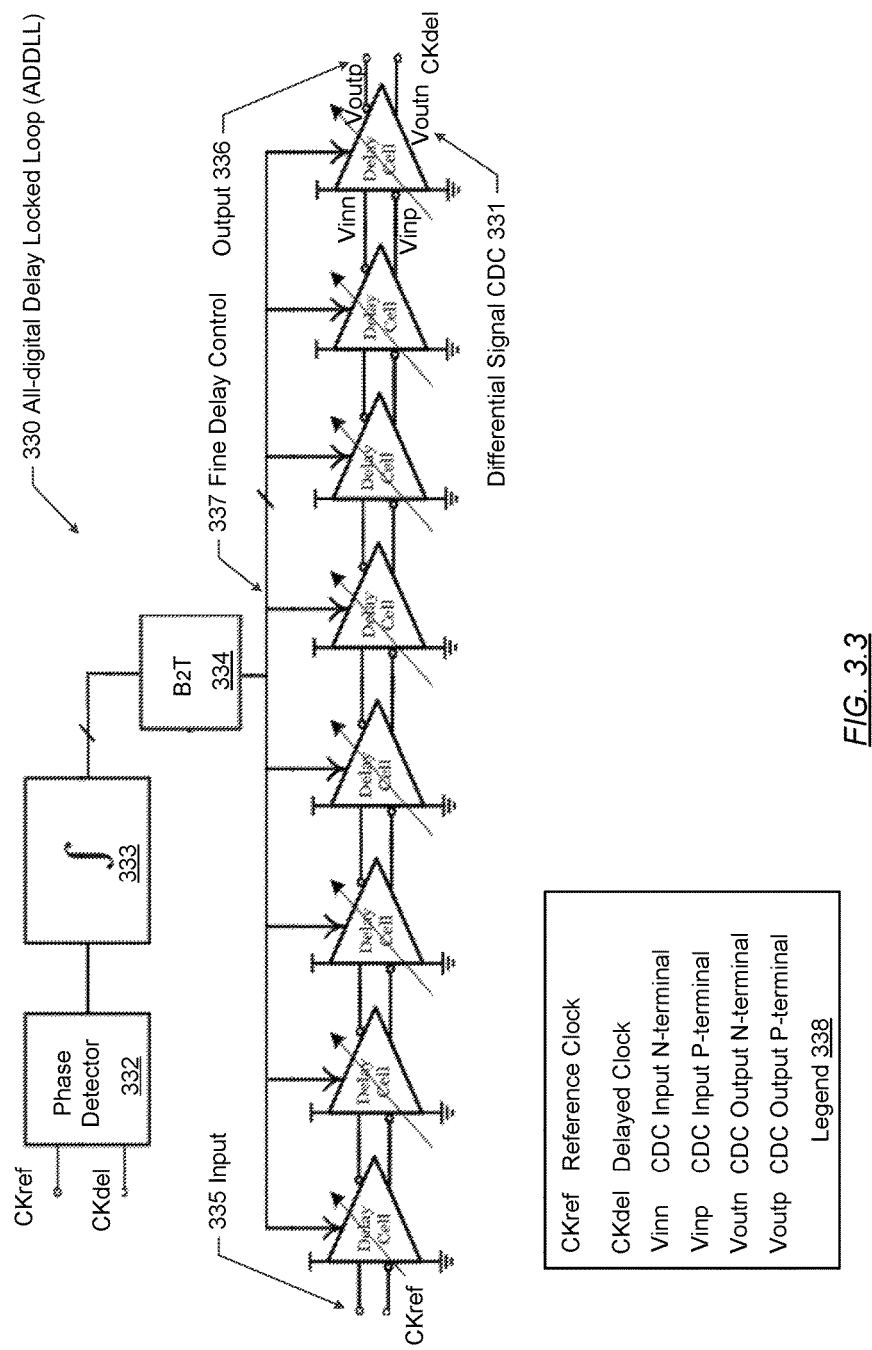
FIG. 3.3

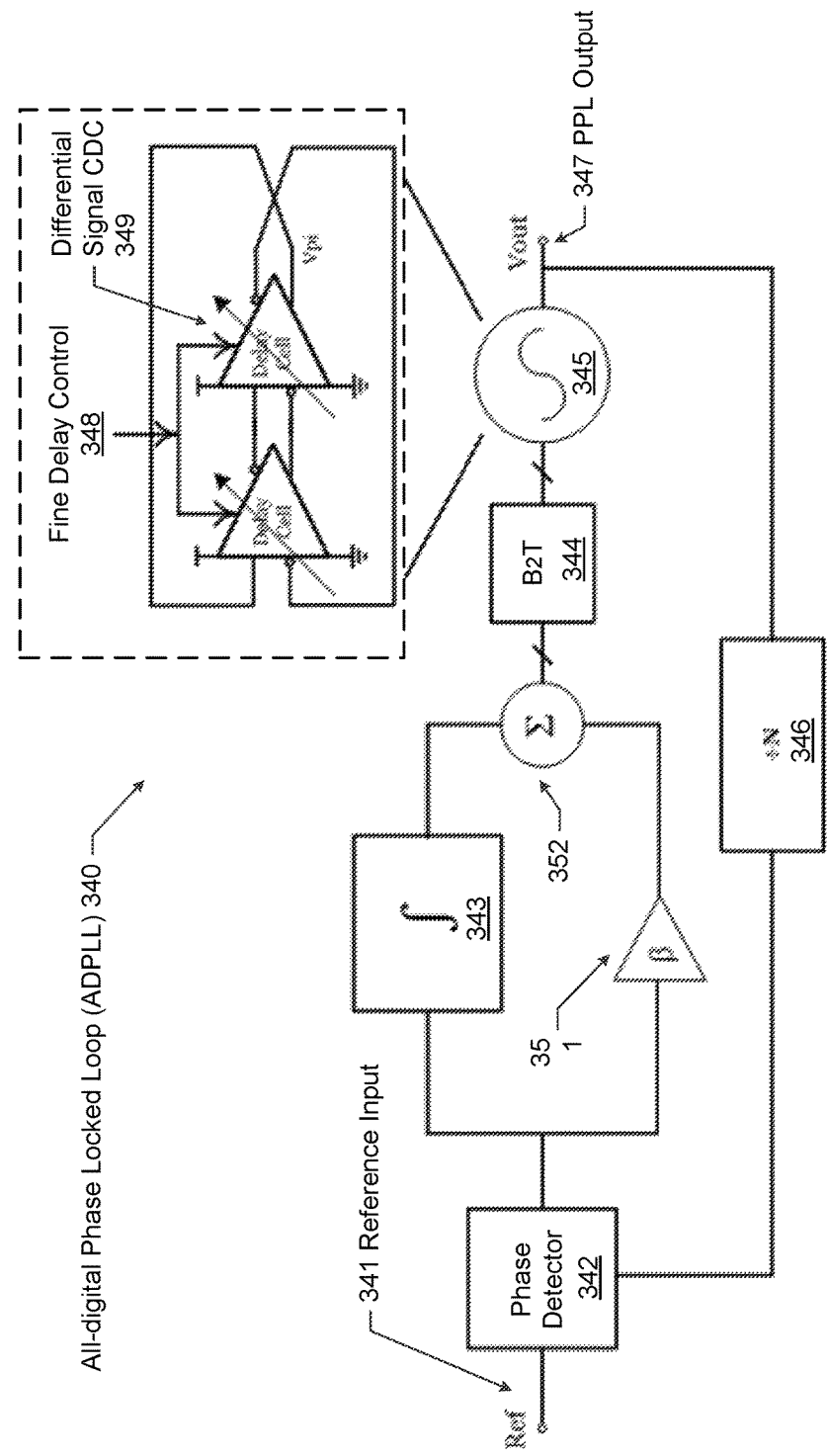
FIG. 3.4

FINE RESOLUTION HIGH SPEED LINEAR DELAY ELEMENT

BACKGROUND

A propagation delay of an electronic circuit is the length of time which starts from when an input signal to the electronic circuit is stable and reaches a valid threshold, to the time when a resultant output signal from the electronic circuit is stable and reaches a corresponding valid threshold. The propagation delay of the electronic circuit may be adjusted by controlling an output current and/or a load capacitance at the output of the electronic circuit.

SUMMARY

In general, in one aspect, the invention relates to a controlled transconductance circuit (CTC). The CTC includes (i) a transistor comprising a drain terminal, a gate terminal, and a transistor source terminal, (ii) a biasing circuit element connected between the transistor source terminal and a CTC source terminal, and a variable capacitor connected between the transistor source terminal and a constant voltage terminal where the constant voltage terminal is adapted to receive a constant voltage, and (iii) a CTC control terminal adapted to control a transconductance of the CTC by controlling a capacitance of the variable capacitor.

In general, in one aspect, the invention relates to a controlled delay circuit (CDC). The CDC includes (i) a controlled transconductance circuit (CTC) including a CTC drain terminal and a CTC source terminal that are adapted to conduct a current of the CTC, a CTC gate terminal adapted to receive an input voltage signal referenced with respect to the CTC source terminal, wherein the input voltage signal modulates the current based on a transconductance of the CTC, and a CTC control terminal adapted to control the transconductance based on a digital bit value applied to the CTC control terminal, and (ii) an output delay capacitor coupled between the CTC drain terminal and a first constant voltage terminal of the CDC, where the first constant voltage terminal is adapted to receive a first constant voltage, and where the transconductance and the output delay capacitor collectively define a signal delay of the input voltage signal from the CTC gate terminal to the CTC drain terminal.

In general, in one aspect, the invention relates to a method for a controlled delay circuit (CDC). The method includes applying a control signal to a control terminal of the CDC, adjusting, based at least on the control signal, a transconductance of the CDC, receiving, at a gate terminal of the CDC, an input voltage signal, and generating, subsequent to receiving the input voltage signal, an output signal at a drain terminal of the CDC with a signal delay, where the signal delay is proportional to a ratio between a load capacitance of the CDC and the transconductance.

Other aspects of the invention will be apparent from the following description and the appended claims.

BRIEF DESCRIPTION OF DRAWINGS

FIGS. 1.1, 1.2, and 1.4 show schematic circuit diagrams in accordance with one or more embodiments of the invention.

FIG. 1.3 shows circuit model in accordance with one or more embodiments of the invention.

FIGS. 3.1, 3.2, 3.3, and 3.4 show an example in accordance with one or more embodiments of the invention.

DETAILED DESCRIPTION

Figure 2:
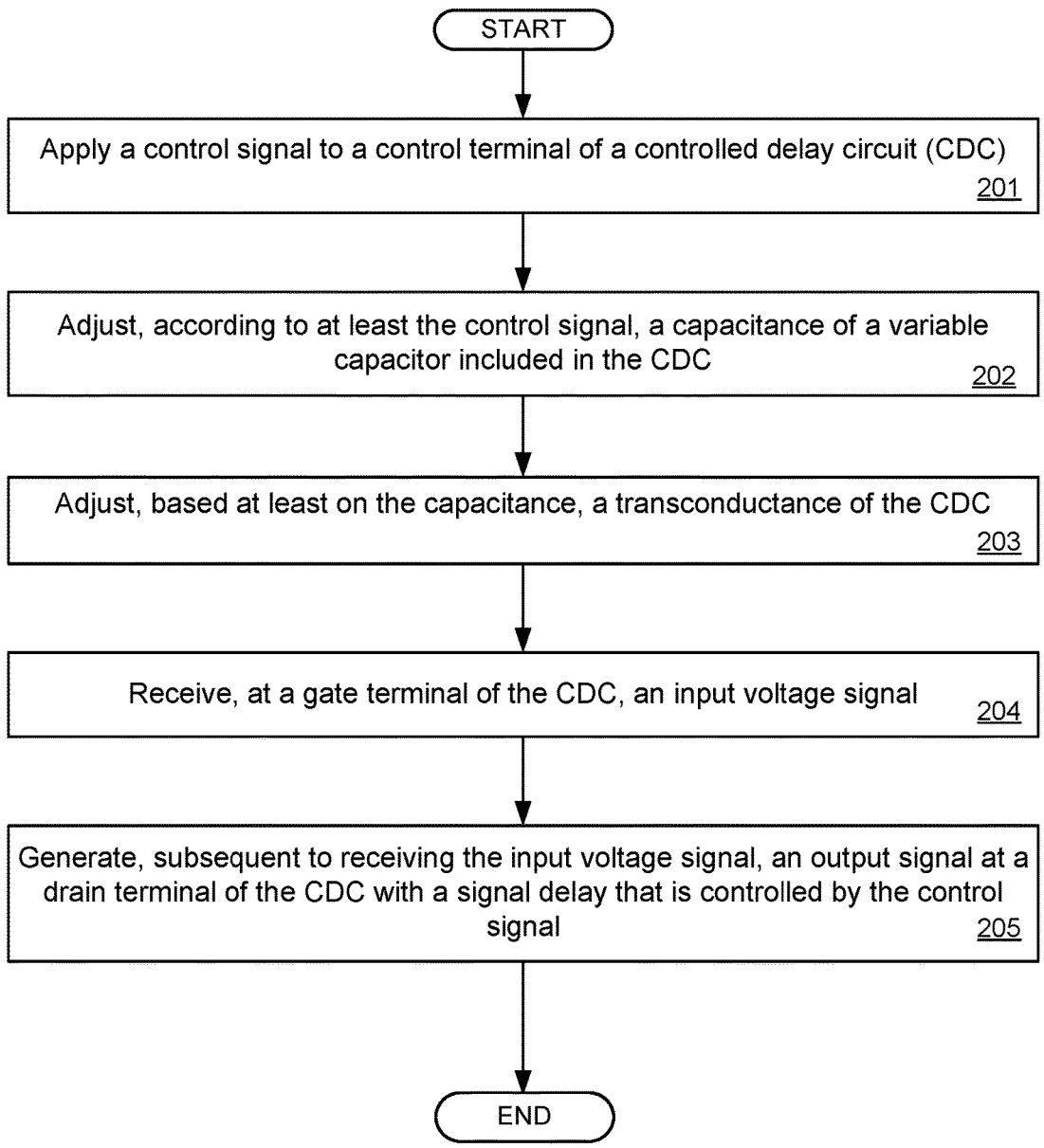
FIG. 2 shows a flowchart in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In the following description, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the invention provide a controlled delay circuit having a propagation delay that is controlled by a control signal. The controlled delay circuit includes a controlled transconductance circuit having a transconductance that is adjusted by the control signal, which in turns controls the propagation delay of the controlled delay circuit. In one or more embodiments, the controlled transconductance circuit includes a variable capacitor connected to a source terminal of a transistor, where the transconductance of the transistor is proportional to a capacitance of the variable capacitor. Accordingly, the propagation delay from a gate terminal of the transistor to a drain terminal of the transistor is controlled by the control signal. In one or more embodiments, the controlled delay circuit is used as a fine resolution high speed linear delay element in a digital phased locked loop circuit or a digital delay locked loop circuit.

FIG. 1.1 shows a diagram of a controlled transconductance circuit (CTC) (100) in accordance with one or more embodiments of the invention. In one or more embodiments, one or more of the modules and elements shown in FIG. 1.1 may be omitted, repeated, and/or substituted. Accordingly, embodiments of the invention should not be considered limited to the specific arrangements of modules shown in FIG. 1.1.

As shown in FIG. 1.1, the CTC (100) includes a transistor (104), a biasing circuit element (105), a variable capacitor A (106), a CTC drain terminal (101), a CTC gate terminal (103), a CTC source terminal (102), a transistor source terminal (102-1), a CTC control terminal (109), and a constant voltage terminal A (110). The CTC drain terminal (101), CTC gate terminal (103), CTC source terminal (102), and CTC control terminal (109) are connection points that connect the CTC (100) to a different circuit. In contrast, the transistor source terminal (102-1) is a connection point within the CTC (100). In particular, the biasing circuit element (105) is connected between the transistor source terminal (102-1) and the CTC source terminal (102). Further, the variable capacitor A (106) is connected between the transistor source terminal (102-2) and the constant voltage terminal A (110). In one or more embodiments, the constant voltage terminal A (110) is adapted to receive a constant voltage, such as from a supply voltage rail or a ground voltage rail that is adapted to supply power to the CTC (100).

In one or more embodiments, the transistor (104) is a N-type or a P-type field effect transistor (FET) that has a transistor drain terminal acting as the CTC drain terminal (101), a transistor gate terminal acting as the CTC gate terminal (103), and the transistor source terminal (102-1) connected to one end of the biasing circuit element (105). In one or more embodiments, the biasing circuit element (105) is an electronic component adapted to provide one or more pre-determined direct current (DC) voltage and/or current (collectively referred to as a DC operating condition) of the transistor (104). For example, the biasing circuit element (105) may be a resistor, an inductor, a current source circuit, etc. In addition, the DC operating condition may include a DC source-drain voltage and/or a DC source-drain current.

For a particular DC operating condition, a transfer curve of the transistor (104) (i.e., transistor transfer curve) is a curve of the transistor source-drain current versus the transistor gate-source voltage. The ratio of the current difference over voltage difference, of two points on the transistor transfer curve, is the transconductance of the transistor (104) (i.e., transistor transconductance) at the DC operating point. A portion of the transistor transfer curve having the transconductance within a pre-determined range is a transistor AC linear region at the DC operating condition. In other words, within the transistor AC linear region, the transistor transfer curve may be graphically represented as a substantially straight line having a slope equivalent to the transistor transconductance. A substantially straight line is a line that satisfies a preset threshold of being straight. An AC voltage signal modulating the transistor gate-source voltage and having a magnitude within the transistor AC linear region is a small signal input to the transistor (104). The transistor transconductance is substantially constant throughout the transistor AC linear region and is referred to as the transistor small signal transconductance. In this context, the transistor small signal transconductance is the transconductance applicable to the small signal input as applied to the transistor (104). In contrast, the transconductance applicable to a signal input exceeding the transistor AC linear region is a transistor large signal transconductance. The transistor transconductance is a characteristic determined based on the geometry, doping concentration, and other semiconductor properties of the transistor (104). In one or more embodiments, the biasing circuit element (105) is configured based on a pre-determined criterion of the transistor AC linear region. For example, the pre-determined criterion may be set to optimize the small signal transconductance of the transistor (104) (i.e., transistor small signal transconductance).

In one or more embodiments, the CTC drain terminal (101) and the CTC source terminal (102) are adapted to conduct a CTC source-drain current of the CTC (101) through the transistor (104) and the biasing circuit element (105). In other words, the CTC source-drain current is a current flowing between the CTC drain terminal (101) and the CTC source terminal (102). In one or more embodiments, the CTC gate terminal (103) (i.e., gate terminal of the transistor (104)) is adapted to receive an input voltage signal referenced with respect to the CTC source terminal (102). For example, the input voltage signal of the CTC (100) may be an AC voltage modulating the CTC gate-source voltage (i.e., voltage between the CTC gate terminal (103) and CTC source terminal (102)). A transfer curve of the CTC (101) (i.e., CTC transfer curve) is a curve of the CTC source-drain current versus the CTC gate-source voltage. The ratio of the current difference over voltage difference, of two points on the CTC transfer curve, is the transconductance of the CTC (100) (i.e., CTC transconductance). A portion of the CTC transfer curve having the transconductance within a pre-determined range is a CTC AC linear region. An AC voltage signal modulating the CTC gate-source voltage and having a magnitude within the CTC AC linear region is a small signal input to the CTC (101). Within the CTC AC linear region, the CTC transfer curve may be graphically represented as a straight line having an error within the pre-determined range. In other words, the CTC transconductance is substantially constant throughout the CTC AC linear region and is referred to as the CTC small signal transconductance. In other words, the CTC small signal transconductance is the transconductance applicable to the CTC small signal input. In contrast, the CTC transconductance applicable to a signal input exceeding the CTC AC linear region is a CTC large signal transconductance. In one or more embodiments, the CTC transconductance of the CTC (100) is proportional to the transistor transconductance of the transistor (104) based on a proportional factor. In one or more embodiments, the proportional factor is determined according to a ratio between the capacitance of the variable capacitor A (106) and a gate-to-source capacitance of the transistor (104). An example of how the CTC transconductance is effected by the transistor transconductance and the capacitance of the variable capacitor A (106) is described in reference to FIG. 1.3 below.

In one or more embodiments, the CTC control terminal (109) is adapted to receive a voltage that controls the CTC transconductance of the CTC (100) by controlling the capacitance of the variable capacitor A (106). In one or more embodiments, the CTC control terminal (109) is adapted to receive an analog voltage that controls the capacitance of the variable capacitor A (106). For example, the variable capacitor A (106) may be a varactor diode having a voltage-dependent capacitance when the p-n junction of the varactor diode is reverse-biased.

In one or more embodiments, the CTC control terminal (109) is adapted to receive a digital value that controls the capacitance of the variable capacitor A (106). For example, the variable capacitor A (106) may include a group of switched capacitors connected in parallel and controlled by the digital value, as shown in FIG. 1.2 below.

FIG. 1.2 shows a diagram of the variable capacitor A (106) in accordance with one or more embodiments of the invention. In one or more embodiments, one or more of the modules and elements shown in FIG. 1.2 may be omitted, repeated, and/or substituted. Accordingly, embodiments of the invention should not be considered limited to the specific arrangements of modules shown in FIG. 1.2.

As shown in FIG. 1.2, the variable capacitor A (106) includes a group of capacitors (e.g., capacitor (107)) selectively connected between the constant voltage terminal A (110) and the transistor source terminal (102-1) via a corresponding group of digital switches (e.g., digital switch (108)). In one or more embodiments, the digital switch (108) is implemented using a N-type field FET or P-type FET having a FET gate terminal controlled by the CTC control terminal (109) to selectively connect the capacitor (107) according to a digital bit value applied to the CTC control terminal (109). For example, when the digital bit value corresponds to a logic "1" state, the capacitor (107) may be connected by the digital switch (108) and contributes to the capacitance of the variable capacitor A (106). In contrast, when the digital bit value corresponds to a logic "0" state, the capacitor (107) may be disconnected by the digital switch (108) and does not contribute to the capacitance of the variable capacitor A (106).

In one or more embodiments, the CTC control terminal (109) is one in a group of CTC control terminals of the CTC (100). In particular, each of the group of digital switches is controlled by a corresponding one in the group of CTC control terminals. The digital bit values applied to the group of CTC control terminals collectively form a digital value. In other words, the digital bit value applied to a CTC control terminal (e.g., CTC control terminal (109)) corresponds to a digital bit in the digital value applied to the group of CTC control terminals. In one or more embodiments, the group of capacitors (e.g., capacitor (107)) have a variety of capacitance values. For example, the variety of capacitance values may include values in a binary system such as 1C, 2C, 4C, 8C, 16C, etc. where C denotes a pre-determined unit capacitance. Accordingly, the capacitance of the variable capacitor A (106) is selectively determined across a numerical range by the digital value applied to the group of CTC control terminals.

FIG. 1.3 shows two small signal circuit models of the CTC (100), depicted in FIG. 1.1 above, according to the legend (135). In one or more embodiments, one or more of the modules and elements shown in FIG. 1.3 may be omitted, repeated, and/or substituted. Accordingly, embodiments of the invention should not be considered limited to the specific arrangements of modules shown in FIG. 1.3.

Specifically, the small signal CTC model A (100-1) of the CTC (100) includes a small signal transistor model (104-1) of the transistor (104) that connects to the variable capacitor A (106), as depicted in FIG. 1.1 above. In FIG. 1.1, within the CTC (100), the biasing circuit element (105) merely provides the DC operating condition for the transistor (104) and does not contribute to the small signal CTC model A (100-1). In one or more embodiments, the small signal transistor model (104-1), depicted in FIG. 1.3, is a hybrid-pi FET model. Specifically, $V_{gs1}$, $C_{gs}$, $g_{m1}$, $r_{on}$, and $i_{out}$ denote the transistor gate-to-source voltage, transistor gate-to-source capacitance, transistor small signal transconductance, output resistance, and output current for the small signal operation of the transistor (104). In addition, $V_{in}$ and C denote the small signal input to the CTC (100) and the capacitance of the variable capacitor A (106) depicted in FIG. 1.1 above. Based on the transistor small signal transconductance "$g_{m1}$", the transistor source-drain current is modeled as the current source with a current equal to $g_{m1}$ times $V_{gs1}$, i.e., "$g_{m1}V_{gs1}$". By considering the capacitor divider configuration of the gate-to-source capacitance "$C_{gs}$" and the variable capacitor A (106) "C", the small signal CTC model A (100-1) is converted into a small signal CTC model B (100-2). Specifically, the current source "$g_{m1}V_{gs1}$"; and the variable capacitor A (106) of the small signal CTC model A (100-1) are replaced in the small signal CTC model B (100-2) by an effective current source with a current equal to $G_{m,eff}$ times $V_{gs1}$, i.e., "$G_{m,eff}V_{gs1}$". $G_{m,eff}$ denotes the CTC transconductance (i.e., effective transconductance) of CTC (100). The slanted arrow overlaying the current source icon indicates that $G_{m,eff}$ has variable values. Eq. 1 and Eq. 2 below show that $G_{m,eff}$ may be controlled by controlling the capacitance of the variable capacitor A (106) "$C_1$". In particular, Eq. 2 is an approximation of Eq. 1 for large values of ron.

$$G_{m,eff} = \frac{g_{m1}r_{on}(sC1 + sCgs) - sCgs(1 + g_{m1}r_{on})}{1 + g_{m1}r_{on} + r_{on}(sC1 + sCgs)} \quad \text{Eq. 1}$$

$$G_{m,eff} = g_{m1}\frac{sC1}{g_{m1} + sC1 + sCgs} \quad \text{Eq. 2}$$

In Eq. 1 and Eq. 2, s denotes the frequency variable in the complex frequency domain. Although the scheme for controlling the CTC transconductance is described above using the small signal circuit models of the CTC (100), the CTC transconductance may also be controlled by controlling the capacitance of the variable capacitor A (106) during large signal operations of the CTC (100).

Because the propagation delay is proportional to the output current "$i_{out}$", which, in turn, is proportional to the CTC transconductance, the aforementioned analog voltage or digital value applied to the control terminal of the CTC may be used to adjust/control the propagation delay of the CTC. In one or more embodiments, the propagation delay of the CTC may be adjusted/controlled within a femto-second (ps) range. An example of controlling the CTC transconductance and propagation delay of the CTC is described in reference to FIG. 3.2 below.

FIG. 1.4 shows a diagram of a controlled delay circuit (CDC) (120) in accordance with one or more embodiments of the invention. In one or more embodiments, one or more of the modules and elements shown in FIG. 1.4 may be omitted, repeated, and/or substituted. Accordingly, embodiments of the invention should not be considered limited to the specific arrangements of modules shown in FIG. 1.4.

As shown in FIG. 1.4, the CDC (120) includes a CTC-P (121), a CTC-N (122), and a variable capacitor B (126). The CTC-P (121) is a CTC, depicted in FIG. 1.1 above, with a P-type FET. In other words, the CTC-P (121) is a P-type CTC. Similarly, the CTC-N (122) is a CTC, depicted in FIG. 1.1 above, with a N-type FET. In other words, the CTC-N (122) is a N-type CTC. The CTC-P (121) and CTC-N (122) are connected to form a complimentary circuit configuration. Specifically, the CTC gate terminals of the CTC-P (121) and CTC-N (122) are connected together as a CDC input terminal (123), which is adapted to receive an input (e.g., an input voltage signal) of the CDC (120). Correspondingly, the CTC drain terminals of the CTC-P (121) and CTC-N (122) are connected together as a CDC output terminal (124), which is adapted to transmit an output (e.g., an output voltage signal) of the CDC (120). Further, the CTC source terminals of the CTC-P (121) and CTC-N (122)

are connected to a supply voltage rail and a ground voltage rail, respectively, that are adapted to supply power to the CDC (120).

As described in reference to FIG. 1.1 above, the CTC control terminals of the CTC-P (121) and CTC-N (122) are adapted to receive respective voltages that control the small signal transconductances of the CTC-P (121) and CTC-N (122) (i.e., CTC small signal transconductances) by controlling capacitances of the variable capacitors embedded in the CTC-P (121) and CTC-N (122). In one or more embodiments, the variable capacitors in the CTC-P (121) and CTC-N (122) may be controlled by an analog voltage and/or a digital value applied to the CTC control terminals. The variable capacitors in the CTC-P (121) and CTC-N (122) may be connected, together or oppositely, to the supply voltage rail and/or ground voltage rail as described in reference to FIG. 1.1 above. The digital switches in the CTC-P (121) and CTC-N (122) may be N-type and/or P-type of FET switches. Accordingly, the analog voltage and/or digital value may be applied in dual polarities and/or complimentary digital values to the CTC control terminals for controlling both types of FET switches. An example of controlling the digital switches in the CTC-P (121) and CTC-N (122) is described in reference to FIG. 1.2 below.

In one or more embodiments, the variable capacitor B (126) depicted in FIG. 1.4 has a similar circuit configuration as the variable capacitor A (106) depicted in FIG. 1.2 above. In particular, the variable capacitor B (126) includes a group of capacitors selectively connected between the constant voltage terminal B (127) and the CDC output terminal (124) via a corresponding group of digital switches. In one or more embodiments, each digital switch is implemented using a N-type field FET or P-type FET having a FET gate terminal controlled by the CDC control terminal (128) to selectively connect a corresponding capacitor according to a digital bit value applied to the CDC control terminal (128).

In one or more embodiments, the variable capacitor B (126) is used as an output delay capacitor coupled between the CTC drain terminals and a constant voltage terminal B (127). The constant voltage terminal B (127) is adapted to receive a constant voltage, such as from the supply voltage rail or ground voltage rail. In one or more embodiments, the constant voltage terminal B (127) is connected to the same voltage rail as one or more of the constant voltage terminals of the CTC-P (121) and CTC-N (122). In one or more embodiments, the constant voltage terminal B (127) is connected to a constant voltage different from one or more of the constant voltage terminals of the CTC-P (121) and CTC-N (122).

In one or more embodiments, the CTC transconductances of the CTC-P (121) and CTC-N (122) in conjunction with the output delay capacitor (i.e., variable capacitor B (126)) collectively define a signal delay of the input voltage signal propagating from the CTC gate terminals (i.e., the CDC input terminal (123)) to the CTC drain terminals (i.e., the CDC output terminal (124)). In one or more embodiments, the signal delay is controlled by an external voltage applied to the CTC control terminals of the CTC-P (121) and CTC-N (122) that controls the CTC transconductances of the CTC-P (121) and CTC-N (122).

In one or more embodiments, the CDC (120) may include additional CTCs that form a differential circuit configuration with the CTC-P (121) and/or CTC-N (122). An example of the differential circuit configuration is shown in FIG. 3.1 below. In one or more embodiments, the CTC transconductances of the CTC-P (121), CTC-N (122), and any additional CTC are referred to as the transconductances of the CDC (120).

FIG. 2 shows a flowchart in accordance with one or more embodiments. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, in Step 201, a control signal is applied to a control terminal of a controlled delay circuit (CDC). In one or more embodiments, the control signal is applied to the CDC by at least applying an analog voltage to a variable capacitor embedded in a controlled transconductance circuit (CTC) of the CDC. In one or more embodiments, the control signal is applied to the CDC by at least applying a digital bit value to one or more digital switches in a CTC of the CDC. In one or more embodiments, the control signal includes a coarse delay control signal and a fine delay control signal. In particular, the coarse delay control signal is generated based on a pre-determined target delay time of the CTC. Specifically, the coarse delay control signal results in a coarse delay time of the CTC. Further, the fine delay control signal is generated based on a difference between the pre-determined target delay time and the coarse delay time. Accordingly, the fine delay control signal improves the precision in a signal delay of the CTC with respect to meeting the pre-determined target delay time. In one or more embodiments, the fine delay control signal improves the precision in the delay time of the CTC according to Steps 202-205 below.

In Step 202, a capacitance of the variable capacitor in the CDC is adjusted according to at least the control signal applied to the control terminal. In one or more embodiments, the variable capacitor is a varactor in the CTC of the CDC. In such embodiments, adjusting the capacitance is based on the analog voltage applied to the varactor. In one or more embodiments, the variable capacitor includes a number of capacitors in the CTC of the CDC that are controlled by corresponding digital switches. In such embodiments, adjusting the capacitance is by activating (i.e., turning on) one or more digital switches based on corresponding digital bit values in the control signal. In response to activating each digital switch, the corresponding capacitor is included (i.e., connected) into the variable capacitor via the activated digital switch.

In Step 203, the transconductance of the CDC is adjusted based at least on the control signal. In one or more embodiments, a CTC transconductance is adjusted by adjusting the capacitance of the variable capacitor embedded in the CTC of the CDC.

In Step 204, an input voltage signal is received at a gate terminal of the CDC. In one or more embodiments, the input voltage signal is further received at a complimentary gate terminal of CDC. For example, the gate terminal and the complimentary gate terminal belong to a N-type CTC and a P-type CTC that are connected to form a complimentary circuit configuration. In another example, the gate terminal and the complimentary gate terminal belong to a N-type CTC and a P-type CTC that are connected to form a differential circuit configuration.

In Step 205, an output signal of the CDC is generated with a signal delay subsequent to receiving the input voltage signal. In one or more embodiments, the output signal is generated at a CTC drain terminal in the CDC. Accordingly, the signal delay is proportional to a ratio between a load capacitance of the CDC and the corresponding CTC transconductance.

FIGS. 3.1, 3.2, 3.3, and 3.4 show an example in accordance with one or more embodiments of the invention. The example shown in FIGS. 3.1-3.4 may be based on the CTC, CDC, and the method flow chart discussed in reference to FIGS. 1.1-1.4 and 2 above. In one or more embodiments, one or more of the modules and elements shown in FIGS. 3.1-3.4 may be omitted, repeated, and/or substituted. Accordingly, embodiments of the invention should not be considered limited to the specific arrangements of modules shown in FIGS. 3.1-3.4.

Specifically, FIG. 3.1 shows a schematic circuit diagram of a differential signal CDC (310) according to the legend (317). As shown in FIG. 3.1, the differential signal CDC (310) includes the differential circuit configuration of a single-ended CDC A (310-1) and a single-ended CDC B (310-2) that has a controlled propagation delay from the differential input terminals Vinn/Vinp to the differential output terminals Voutn/Voutp. The controlled propagation delay may be controlled by various fine delay controls (e.g., fine delay control (314)) and coarse delay controls (e.g., coarse delay control (315)). For example, using the method described in reference to FIG. 2 above, the fine delay controls adjust the propagation delay in the femto-second (ps) range while coarse delay controls adjust the propagation delay in the pico-second (ns) range. Each of the single-ended CDC A (310-1) and single-ended CDC B (310-2) is substantially same as the CDC (120) depicted in FIG. 1.4 above.

The single-ended CDC A (310-1) includes a complimentary circuit configuration of a P-type CTC A (311-1) and a N-type CTC B (311-2) that are based on the CTC (100) depicted in FIG. 1.1 above. Specifically, each of the CTC N-MOS transistor and CTC P-MOS transistor (i.e., Mn1, Mp1) corresponds to the transistor (104) depicted in FIG. 1.1 above. Each of the P-type CTC A (311-1) and N-type CTC B (311-2) includes a digitally controlled variable capacitor, such as the variable capacitor (312-1). The fine delay control (314) corresponds to the CTC control terminal (109) depicted in FIG. 1.1 above.

In addition, each of the current source N-MOS and current source P-MOS (i.e., Mn2, Mp2), in conjunction with an associated variable resistor, corresponds to the biasing circuit element (105) depicted in FIG. 1.1 above. The variable resistor (312-2) includes multiple switched resistors individually controlled by a supply variation compensation control (316). Based on a digital value applied to individual bits of the supply variation compensation control (316), the resistance of the variable resistor (312-2) is adjusted according to the digital value. The combination of the current source P-MOS and the variable resistor (312-2) determines the DC operating condition of the CTC P-MOS transistor (i.e., Mp1). By adjusting the resistance of the variable resistor (312-2), the supply voltage variation of the CTC A (311-1) may be compensated. The variable resistor (312-5) is similar to the variable resistor (312-2) and is implemented using MOS transistor switches.

Similar to the single-ended CDC A (310-1), the single-ended CDC B (310-2) includes a combination of a P-type CTC C (311-3) and a N-type CTC D (311-4). For example, the CTC C (311-3) includes a variable capacitor (312-4) for controlling the transconductance and a variable resistor (312-3) for compensating the supply voltage variation. In addition, variable output capacitors (313) are connected to the differential output terminals Voutn/Voutp. The capacitances of the variable output capacitors (313) are adjusted digitally by the coarse delay controls (e.g., coarse delay control (315)) to control the propagation delay of the differential signal CDC (310) at the coarse level (i.e., pico-second range). In contrast, the propagation delay of the differential signal CDC (310) is digitally controlled at the fine level (i.e., femto-second range) by the fine delay controls (e.g., fine delay control (314)).

FIG. 3.2 shows a plot (321) of modeled effective transconductance and a plot (322) of propagation delay based on delay control ramp. For example, the plot (321) may correspond to the CTC (100) depicted in FIG. 1.1 above. Each curve of the plot (321) may represent the effective CTC transconductance (i.e., $G_{m,eff}$) versus the operating frequency with a particular analog voltage or digital value applied to the CTC control terminal (109) depicted in FIG. 1.1 above. In another example, the plot (321) may correspond to the CTC A (311-1), CTC B (311-2), CTC C (311-3), or CTC D (311-4) depicted in FIG. 3.1 above. Each curve of the plot (321) may represent the effective CTC transconductance (i.e., $G_{m,eff}$) versus the operating frequency with a particular digital value applied to the fine delay controls (e.g., fine delay control (314)) depicted in FIG. 3.1 above. As shown in the plot (321), $G_{m,eff}$ is substantially linear with respect to the analog voltage and/or digital value applied to the CTC control terminal and/or the fine delay controls.

The plot (322) is the simulated multiple stage fine delay CTC with a ramping delay control. For example, the plot (322) may be based on the CTC (100) depicted in FIG. 1.1 above. The ramping delay control corresponds to a linearly increasing (over time) analog voltage or digital value applied to the CTC control terminal (109) depicted in FIG. 1.1 above. In another example, the plot (322) may be based on the CTC A (311-1), CTC B (311-2), CTC C (311-3), or CTC D (311-4) depicted in FIG. 3.1 above. The ramping delay control corresponds to a linearly increasing (over time) digital value applied to the fine delay controls (e.g., fine delay control (314)) depicted in FIG. 3.1 above. Because $G_{m,eff}$ is substantially linear with respect to the analog voltage and/or digital value applied to the CTC control terminal and/or the fine delay controls, the propagation delay is substantially linear (e.g., in femto-second range resolution and linearity) with respect to the ramped analog voltage or the ramped digital value applied to the CTC control terminal and/or the fine delay controls. In contrast, the coarse delay control using the output capacitor does not provide the linearity comparable to the plot (322). Accordingly, the fine delay control and control linearity of the differential signal CDC (310) may be used in multiple delay controlled and frequency controlled systems, such as an all-digital delay locked loop (ADDLL) and an all-digital phase locked loop (ADPLL).

FIG. 3.3 shows a schematic circuit diagram of an all-digital delay locked loop (ADDLL) (330) according to the legend (338). For example, the ADDLL (330) may be based on the differential signal CDC (310) depicted in FIG. 3.1 above. A shown in FIG. 3.3, the ADDLL (330) includes a phase detector circuit (332), an integrator circuit (333), and a binary to thermometer (B2T) converter (344) that collectively generate the fine delay control (337) for controlling the propagation delays of a series of differential signal CDCs (e.g., differential signal CDC (331)). The phase detector circuit (332) includes an arbiter, analog-to-digital converters, and time-to-digital converters. The phase detector circuit (332) compares a delayed clock CKdel and a reference clock CKref to generate an input to the integrator circuit (333) and B2T (334) for generating fine delay control (337). Accordingly, the propagation delay from the input (335)

(i.e., the reference clock CKref) to the output (336) (i.e., the delayed clock CKdel) is controlled within a femto-second resolution. The 8-stages in the series of differential signal CDCs collectively generate 16-phases of the signal propagating through the ADDLL (330).

FIG. 3.4 shows a schematic circuit diagram of an all-digital phase locked loop (ADPLL) (340) based on the differential signal CDC (310) depicted in FIG. 3.1 above. A shown in FIG. 3.3, the ADPLL (340) includes a phase detector circuit (342), an integrator circuit (343), a feed forward circuit (351), a summation circuit (352), and a B2T converter (344) that collectively generate the fine delay control (348) for controlling the propagation delays of a two-stage series of differential signal CDCs (e.g., differential signal CDC (349)). The differential output of the two-stage series is inverted and fedback to the differential input of the two-stage series to form a ring oscillator (345). In addition, the differential output of the two-stage series is divided by the divider circuit (346) and compared to the reference input (341) using the phase detector circuit (342) to complete the phase locked loop. Accordingly, the frequency and phase of the ring oscillator (345) are controlled within a femto-second resolution.

Based on the fine delay control and delay control linearity described above, the differential signal CDC may be advantageously used as a high speed, fine resolution (i.e., femto-second range), linear, and all digital delay element in high speed ADPLL architectures (e.g., Type 1, Typed 2, injection locked), ADDLLs and timing offset calibrations with low power consumption and low chip area. One or more embodiments may also enable high loop bandwidth all-digital jitter cancellations for PLLs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A controlled transconductance circuit (CTC), comprising:
   a transistor comprising a drain terminal, a gate terminal, and a transistor source terminal;
   a biasing circuit element connected between the transistor source terminal and a CTC source terminal;
   a variable capacitor connected between the transistor source terminal and a constant voltage terminal, wherein the constant voltage terminal is adapted to receive a constant voltage; and
   a CTC control terminal adapted to control a transconductance of the CTC by controlling a capacitance of the variable capacitor, the transconductance is utilized to set a propagation delay between the gate terminal and the drain terminal of the CTC.

2. The CTC of claim 1,
   wherein the drain terminal and the CTC source terminal are adapted to conduct a current of the CTC,
   wherein the gate terminal is adapted to receive an input voltage signal referenced with respect to the CTC source terminal,
   wherein the input voltage signal modulates the current based on the transconductance of the CTC,
   wherein the transconductance of the CTC is proportional to a transconductance of the transistor based on a proportional factor, and
   wherein the proportional factor is determined according to a ratio between the capacitance of the variable capacitor and a gate-to-source capacitance of the transistor.

3. The CTC of claim 1, wherein the variable capacitor comprises:
   a plurality of capacitors selectively connected between the constant voltage terminal and the transistor source terminal via a plurality of digital switches,
   wherein at least one of the plurality of digital switches is controlled by the CTC control terminal to selectively connect a corresponding capacitor according to a digital bit value applied to the CTC control terminal.

4. The CTC of claim 3,
   wherein the CTC control terminal is comprised in a plurality of CTC control terminals of the CTC, and
   wherein the digital bit value applied to the CTC control terminal corresponds to a digital bit in a digital value applied to the plurality of CTC control terminals.

5. The CTC of claim 4,
   wherein the at least one of the plurality of digital switches comprises a field effect transistor having a gate input coupled to the CTC control terminal.

6. The CTC of claim 1,
   wherein the transistor comprises at least one selected from a group consisting of an N-type field effect transistor (FET) and a P-type FET, and
   wherein the constant voltage terminal is adapted to connect to at least one selected from a group of a supply voltage rail and a ground voltage rail to receive the constant voltage.

7. The CTC of claim 1,
   wherein the capacitance of the variable capacitor is controlled by an analog voltage applied to the CTC control terminal.

8. The CTC of claim 1,
   wherein the propagation delay is adjusted within a femto-second range.

9. The CTC of claim 1,
   wherein the propagation delay is proportional to output current from the drain terminal which is proportional to the controlled transconductance.

10. The CTC of claim 1,
    wherein the CTC control terminal is controlled by fine delay controls for adjustment in a pico-second range and coarse delay controls for adjustment in a femto-second range.

11. A controlled transconductance circuit (CTC) method, comprising:
    providing a CTC comprising:
      a transistor comprising a drain terminal, a gate terminal, and a transistor source terminal;
      a biasing circuit element connected between the transistor source terminal and a CTC source terminal;
      a variable capacitor connected between the transistor source terminal and a constant voltage terminal, wherein the constant voltage terminal is adapted to receive a constant voltage; and
      a CTC control terminal adapted to control a transconductance of the CTC by controlling a capacitance of the variable capacitor, the transconductance is utilized to set a propagation delay between the gate terminal and the drain terminal of the CTC.

12. The CTC method of claim 11,
wherein the drain terminal and the CTC source terminal are adapted to conduct a current of the CTC,
wherein the gate terminal is adapted to receive an input voltage signal referenced with respect to the CTC source terminal,
wherein the input voltage signal modulates the current based on the transconductance of the CTC,
wherein the transconductance of the CTC is proportional to a transconductance of the transistor based on a proportional factor, and
wherein the proportional factor is determined according to a ratio between the capacitance of the variable capacitor and a gate-to-source capacitance of the transistor.

13. The CTC method of claim 11, wherein the variable capacitor comprises:
a plurality of capacitors selectively connected between the constant voltage terminal and the transistor source terminal via a plurality of digital switches,
terminal to selectively connect a corresponding capacitor according to a digital bit value applied to the CTC control terminal.

14. The CTC method of claim 13,
wherein the CTC control terminal is comprised in a plurality of CTC control terminals of the CTC, and
wherein the digital bit value applied to the CTC control terminal corresponds to a digital bit in a digital value applied to the plurality of CTC control terminals.

15. The CTC method of claim 14,
wherein the at least one of the plurality of digital switches comprises a field effect transistor having a gate input coupled to the CTC control terminal.

16. The CTC method of claim 11,
wherein the transistor comprises at least one selected from a group consisting of an N-type field effect transistor (FET) and a P-type FET, and
wherein the constant voltage terminal is adapted to connect to at least one selected from a group of a supply voltage rail and a ground voltage rail to receive the constant voltage.

17. The CTC method of claim 11,
wherein the capacitance of the variable capacitor is controlled by an analog voltage applied to the CTC control terminal.

18. The CTC method of claim 11,
wherein the propagation delay is adjusted within a femto-second range.

19. The CTC method of claim 11,
wherein the propagation delay is proportional to output current from the drain terminal which is proportional to the controlled transconductance.

20. The CTC method of claim 11,
wherein the CTC control terminal is controlled by fine delay controls for adjustment in a pico-second range and coarse delay controls for adjustment in a femto-second range.

* * * * *